United States Patent [19]

Fox et al.

[11] Patent Number: 4,911,781
[45] Date of Patent: Mar. 27, 1990

[54] VLS FIBER GROWTH PROCESS

[75] Inventors: Joseph R. Fox, Solon; Douglas A. White, Cleveland Heights, both of Ohio

[73] Assignee: The Standard Oil Company, Cleveland, Ohio

[21] Appl. No.: 311,454

[22] Filed: Feb. 16, 1989

Related U.S. Application Data

[63] Continuation-in-part of Ser. No. 46,829, May 5, 1987, abandoned.

[51] Int. Cl.$^4$ .................. C01B 31/36; C01B 25/18
[52] U.S. Cl. .................................. 156/607; 156/609;
156/612; 156/614; 156/DIG. 112; 501/12;
501/35; 501/95; 23/300; 423/346; 427/397.7;
427/190; 427/193; 264/DIG. 19
[58] Field of Search ........................... 501/12, 35, 95;
156/607, 609, 612, 614, DIG. 112; 23/300;
423/346; 427/397.7, 190, 193; 264/DIG. 19

[56] References Cited

U.S. PATENT DOCUMENTS

| 3,423,179 | 1/1969 | Webb et al. | 23/208 |
| 3,519,472 | 7/1970 | Dyne et al. | 117/106 |
| 3,622,272 | 11/1971 | Shyne et al. | 23/208 |
| 3,630,691 | 12/1971 | Burnett et al. | 23/300 |
| 3,692,478 | 9/1972 | Knippenberg et al. | 423/345 |
| 3,721,732 | 3/1973 | Knippenberg et al. | 423/346 |
| 3,778,296 | 12/1973 | Thalmann et al. | 117/106 C |
| 3,840,647 | 10/1974 | Tomita et al. | 423/291 |
| 3,875,296 | 4/1975 | Brubaker | 501/108 |
| 4,013,503 | 3/1977 | Knippenberg et al. | 156/609 |
| 4,491,569 | 1/1985 | Tibbets | 423/447.3 |
| 4,500,504 | 2/1985 | Yamamoto | 423/345 |
| 4,612,138 | 9/1986 | Keiser | 252/313.2 |
| 4,732,879 | 11/1988 | Kalinowski et al. | 502/171 |
| 4,789,537 | 12/1988 | Shalek et al. | 423/346 |
| 4,806,198 | 2/1989 | Jagota et al. | 501/95 |

FOREIGN PATENT DOCUMENTS

| 197686 | 10/1986 | European Pat. Off. |
| 2592399 | 12/1986 | France |
| 60-210600 | 10/1985 | Japan |
| 61-295299 | 12/1986 | Japan |
| 62-003098 | 1/1987 | Japan |
| 1360197 | 7/1974 | United Kingdom |

OTHER PUBLICATIONS

Hawley, *The Condensed Chemical Dictionary*, 10th Ed., Van Nostrand Reinhold Co., NY (1981) pp. 956, 958.
T. Takahashi, K. Sugiyama and H. Itah "Single Crystal Growth of Titanium Carbide by Chemical Vapor Deposition" Electrochemical Soc.: Solid State Science, vol. 117, No. 4 (Apr. 1970) pp. 541–545.
(List continued on next page.)

*Primary Examiner*—Brian E. Hearn
*Assistant Examiner*—Andrew Griffis
*Attorney, Agent, or Firm*—Larry W. Evans; Joseph G. Curatolo

[57] ABSTRACT

A method for preparing substrates for VLS fiber producing reactions and a method for preparing SiC fibers by the VLS process. The first method includes the steps of forming an alcohol sol containing a fiber growth promoter material precursor, applying the sol to at least one surface of the substrate and drying the sol. More particularly, the steps can include forming a sol of colloidal hydrous metal oxide particles in a liquid, the metal oxide being a fiber growth promoter material precursor and the liquid being capable of dissolving a salt of the metal and of wetting the substrate surface as a sol, applying the sol to at least one surface of the substrate and drying the sol. The method for the production of SiC fibers includes the steps of applying to at least one surface of a non-metallic, high temperature resistant substrate a sol coating containing a SiC fiber growth promoter material precursor, drying the sol coating and contacting the substrate with silicon and carbon containing gases at a temperature of about 1300° C. to about 1500° C.

42 Claims, 2 Drawing Sheets

OTHER PUBLICATIONS

N. Tamari and A. Kato "Catalystic Effect of Nickel on the Growth of Zirconium Carbide Whiskers by Chemical Deposition" Journal of the Less Common Metals, 58 (1978) pp. 147–160.

N. Tamari and A. Kato "Catalytic Effects of Various Metals and Refractory Oxides on the Growth of TiC Whiskers by Chemical Vapor Deposition" Journal of Crystal Growth 46 (19/9) pp. 221–237.

A. Kato "Some Common Aspects of the Growth of TiN, ZrN, TiC and ZrC Whiskers in Chemical Vapor Deposition" Journal of Crystal Growth 49(1980), pp. 199–203.

91:159811r, F. Onishi, N. Odake, T. Suzuki, Y. Anzai and M. Izawa "Dispersion of Fine Metallic Compounds at a High Concentration of Organic Solvents" Chemical Abstracts vol. 91, No. 20 (1979) p. 121.

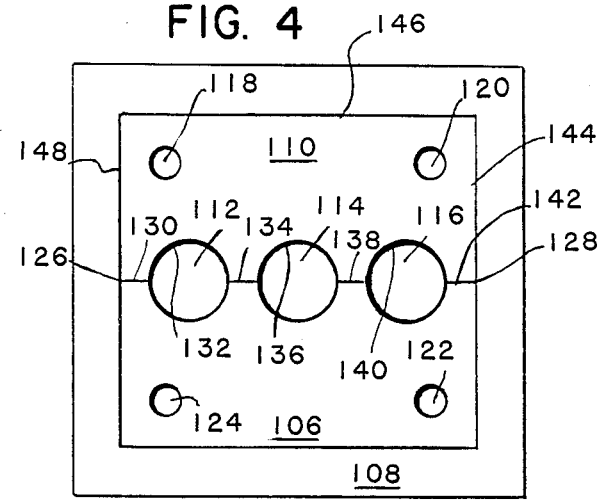
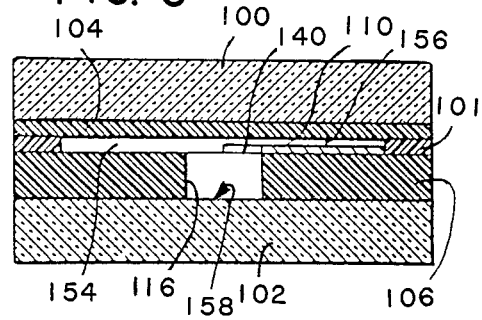
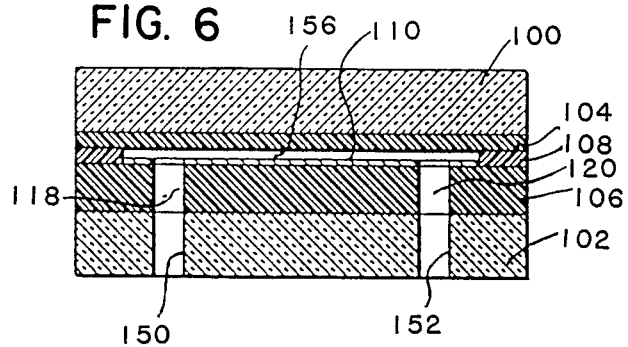

VLS FIBER GROWTH PROCESS

CROSS-REFERENCE TO RELATED APPLICATION

This application is a continuation-in-part of U.S. Ser. No. 046,829 filed May 5, 1987 now abandoned.

TECHNICAL FIELD

The present invention relates generally to the growth of inorganic fibers via the vapor-liquid-solid process. More particularly, it relates to an improvement in the method concerning the formation of fiber growth promoters on substrate material. A method is also provided in which a substrate is prepared for the growth of silicon carbide fibers.

BACKGROUND OF THE INVENTION

The mechanism of VLS (vapor-liquid-solid) growth of inorganic fibers, or filamentary "whisker" crystals of silicon and other materials, including silicon carbide, was first proposed by Wagner and Ellis in *The Vapor-Liquid-Solid Mechanism of Crystal Growth and its Application to Silicon*, Transactions of the Metallurgical Society of AIME, 233, 1053 (1965). According to the VLS mechanism, in the vapor deposition of crystalline material such as silicon onto a substrate, a droplet of liquid is situated between the vapor and the growing crystal. The surface of the liquid is a preferred site for deposition from the vapor. The liquid becomes supersaturated with material supplied by the vapor, and crystal growth occurs by precipitation at the solid-liquid interface.

The mechanism was supported by the observations that whiskers of crystals of $Al_2O_3$, SiC, and BeO had rounded terminations at their tips, regrown silicon whiskers exhibited a liquid-like globule at the tip, and certain impurities were essential to silicon whiskers, rather than film, growth.

It was determined that the impurities identified were whisker growth promoting agents which formed a liquid solution with the crystalline material to be grown at the deposition temperature. This growth promoting agent was found in the hemispherical terminations of the tips of the VLS grown whiskers. Silicon was suggested as a growth promoting agent for SiC whiskers.

The formation of inorganic fibers, such as SiC, by the VLS process has been investigated by the contacting, with a reactive gas, of a growth promoter containing substrate at elevated temperature. The reactive gas contained components of the fiber to be deposited, such as silicon and carbon for SiC fibers. Generally, growth of the fibers has been observed roughly normal to the surface of the substrate, the growth promoter tip being disposed on the end of the fiber opposite the substrate.

For example, U.S. Pat. No. 3,519,472 describes the growth of silicon carbide whiskers having a knob of an alloy of iron and silicon, sometimes in combination with nickel, titanium or other metals, generated by the reaction of silicon monoxide, carbon monoxide and hydrogen over substrates of silicon nitride, silicon carbide, alumina or carbon, where the metl was present in the substrate or the refractory brick lining the high temperature reaction furnace.

Fiber growth promoter materials proposed include metals, alloys and compounds of iron, nickel, manganese, chromium and titanium.

Silicon carbide fibers or whiskers have shown suitability for use as reinforcing materials for composites, in which the matrix material may be polymeric resins, glasses, silicon, aluminum, copper or another ceramic, such as $Si_3N_4$ or $Al_2O_3$.

In order to be commercially viable, SiC fibers produced by the VLS process must exhibit reproducibility regarding length and diameter, parameters which in previous embodiments have varied by as much as 100 percent from one production run to the next. U.S. Pat. No. 3,519,472 supra reports a tenfold difference in length to thickness ratios of from 10:1 to 100:1.

We have traced this problem to the preparation of the substrate material for the reaction, particularly the treatment of the substrate with fiber growth promoter material.

Various methods for treating the substrate with the fiber growth promoter material have been proposed. Application of the material onto a roughened substrate was proposed in U.S. Pat. No. 3,692,478; sprinkle, powder or vapor deposition in U.S. Pat. No. 3,721,732; and brush, dust or vapor deposition in U.S. Pat. No. 4,013,503. In U.S. Pat. No. 3,622,272 it was proposed to apply the material by brushing on the substrate a powdered metal suspended in a liquid vehicle, exemplified as an equal volume of acryloid resin and an alcohol. In U.S. Pat. No. 3,778,296, it was proposed that a layer of carbon (such as charcoal), growth promoter and synthetic or natural lacquer (in a solvent) be applied with a brush onto the substrate.

One conventional method for preparing substrates for SiC fiber production is dipping in or brushing onto a substrate, a binder mixture, such as polymethylmethacrylate and fumed silica in methylethylketone, and sprinkling onto the coated substrate, the fiber growth promoter as a metal powder.

These conventional methods of preparing substrates generally produce inhomogeneous substrates in which the particle size range of fiber growth promoter material is large, and the distribution of such particles over the substrate surface is disordered, often with gaps existing on the surface.

In addition, when the ratio of binder to promoter is too large, a less active carbon rich promoter is formed, and black undergrowth is formed on the substrate among the green beta-SiC fibers. When the ratio of binder to promoter is too small, the promoter material powders are not bound to the substrate, and are lost.

Furthermore, vapor deposition techniques require expensive capital instruments to carry out the deposition, with commercial scaleup being questionable.

It is necessary, therefore, for economic commercialization of fibers of the desired uniform qualities and characteristics that an inexpensive and a more reproducible method of preparing substrates be employed.

DISCLOSURE OF THE INVENTION

The present invention is directed to an improved method for producing inorganic fibers by the VLS process. The invention is further directed to a simple and inexpensive method of preparing substrates for the VLS production of inorganic fibers.

It is, therefore, an object of the present invention to provide a method of preparing a non-metallic, high temperature resistant substrate for a VLS fiber producing reaction comprising the steps of forming an alcohol sol containing a fiber growth promoter material precursor, applying the sol to at least one surface of the substrate and drying the sol.

It is another object of the present invention to provide a method of preparing a non-metallic, high temperature resistant substrate for a VLS fiber producing reaction comprising the steps of forming a sol of colloidal hydrous metal oxide particles in a liquid, the metal oxide being a fiber growth promoter material precursor and the liquid being capable of dissolving a salt of the metal and of wetting the substrate surface as a sol, applying the sol to at least one surface of the substrate and drying the sol.

It is another object of the present invention to provide a method for preparing a non-metallic, high temperature resistant substrate for the production of SiC fibers by the VLS process comprising the steps of forming a solution of an iron salt in methanol, adding a base to the solution to precipitate out colloidal hydrous iron oxide particles to form a sol, applying the sol to at least one surface of the substrate, drying the sol, and heat treating the sol applied substrate in an inert gas atmosphere at a temperature of about 1000° C. to about 1500° C.

The method of preparing such substrates provides a homogeneous, ordered distribution of adherent, active particles of fiber growth promoting material on at least one surface of the substrate. This preparation method minimizes the nonuniform undergrowth of material among the fibers produced by the VLS process.

It is yet another object of the present invention to provide a method for preparing inorganic fibers by a VLS process comprising the steps of applying to at least one surface of a non-metallic, high temperature resistant substrate a sol coating containing a fiber growth promoter material precursor, drying the sol coating and contacting the substrate with gaseous components of the fibers at VLS reaction temperature.

It is a further object of the present invention to provide a method for the production of SiC fibers by the VLS process comprising the steps of applying to at least one surface of a non-metallic, high temperature resistant substrate a sol coating containing a SiC fiber growth promoter material precursor, drying the sol coating and contacting the substrate with silicon and carbon containing gases at a temperature of about 1300° C. to about 1500° C.

BRIEF DESCRIPTION OF THE DRAWINGS

FIG. 4 is a scanning electron photo micrograph (magnification 240X) of a VLS graphite substrate dip coated with binder and sprinkled with iron/silicon alloy particles.

PREFERRED EMBODIMENTS FOR CARRYING OUT THE INVENTION

Figure 1:
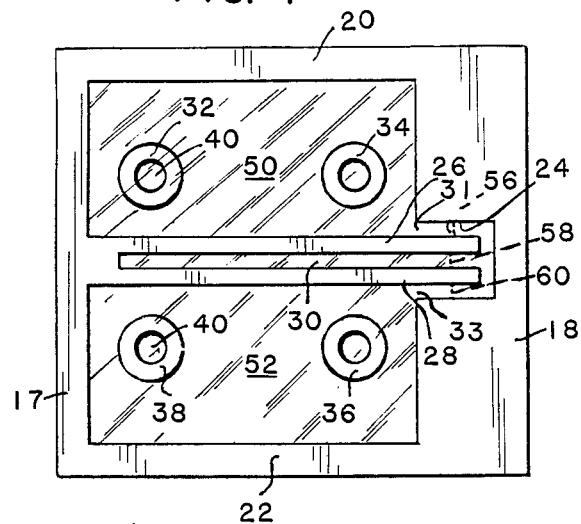
FIG. 1 is a scanning electron photo micrograph (magnification 50X) of a heat treated VLS graphite substrate coated with a sol prepared using methanol and iron nitrate according to the prevent invention.

The present invention is directed to the preparation of a substrate for the production, by the VLS process, of inorganic fibers, involving forming a sol from a liquid which has good wetting properties with regard to the substrate material, which liquid is a solvent for and contains a fiber growth promoter material precursor, and applying the sol to the substrate.

As used in this specification, whiskers have a diameter of less than one micron, typically about 0.5 microns, and lengths that are less than 100 microns. Fibers are considerably larger, having a diameter greater than one micron, typically five to 10 microns, and lengths that are greater than 1000 microns, typically greater than 5000 microns. Fibers produced according to the method of the present invention have lengths of about one inch (2.5 cm) or more.

Also as used in this specification, the term sol refers to a colloidal suspension of particles, and according to the invention comprises a colloidal suspension of hydrous metal oxide particles which have been precipitated from a soluble metal salt dissolved in a solvent which is capable of wetting the substrate material as a sol. The colloidal particles are generally less than or equal to about one micron in size.

Substrates which can be used according to the present invention include non-metallic, high temperature resistant materials such as graphite, glassy carbon, silicon carbide, alumina and silicon nitride, however graphite, or another material such as glassy carbon, which is mildly reactive with the fiber growth promoter material at either heat treating or VLS reaction temperatures is preferred. This mild reactivity aids in bonding the promoter to the substrate prior to the fiber growth method, and also in reducing the precursor oxide to the active metal species. Substrates which are not reductants for the promoter are also suitable, as hydrogen in the VLS process gas can reduce the oxide. Finally, the substrate must be capable of withstanding the temperatures encountered during substrate treatment and fiber preparation which eliminates the use of metals, such as stainless steel.

Fibers which can be produced according to the invention include beta-silicon carbide (beta-SiC), silicon, graphite, silicon nitride or other fibers grown by a VLS type mechanism. The fibers are produced by contacting the promoter-treated substrate at VLS reaction temperatures with gaseous components of the fibers to be produced. The invention has been shown to be particularly effective in the production of silicon carbide fibers.

Fiber growth promoter materials suitable for use in the present invention include those which are effective in promoting SiC fiber growth, and include iron, manganese, nickel, cobalt, chromium, molybdenum, lanthanum and mixtures, compounds or alloys thereof. Preferred combinations are iron/nickel/chromium and iron/nickel.

According to the method of the invention, the fiber growth promoter material is applied to the substrate as a component of a sol. The sol is formed by introducing a base into a liquid solution of a soluble salt of the desired fiber growth promoting metal or metals, the liquid being capable of wetting the substrate material as a component of the sol and being preferably organic, most preferably a low molecular weight alcohol.

Use of the solution itself is not a suitable means of applying the fiber growth promoter to the surface. The solution provides a very non-uniform size distribution of catalyst particles with diameters between 0.1 and 5 microns which are suitable for whisker synthesis but do not provide a suitable catalyst for the growth of fibers having diameters in the five to 10 micron range. The whiskers produced using the solution are so small that they are very difficult to harvest from the substrate surface.

By way of example, but not limitation, the formation of a sol using methanol and iron nitrate is described hereinbelow.

Sol Preparation

A methanolic sol of hydrous iron oxide particles was prepared by titrating 2.43 g of $Fe(NO_3)_3.9H_2O$ in 100 ml methanol with concentrated $NH_4OH$ until the solution reached pH=7 as read by a pH meter (it being noted that pH generally characterizes aqueous systems). The solution formed a precipitate that was allowed to settle in a closed container. After settling was completed, 35 ml of the clear, supernatant liquid was removed, leaving only the portion of the solution in which the hydrous iron oxide had settled as a sol.

During titration of the iron nitrate solution, relatively high molecular weight polycations were formed which served as precursors to the colloidal dispersions (sols) that were formed. Preferably, the solutions were not titrated to an exact equilibrium, so that the sols which were formed contains hydrous iron oxides which precipitated out of solution.

It is thought that the hydrous metal salt undergoes deprotonation and condensation reactions in the presence of base to form colloidal anhydrous metal oxide particles of the formula $M_nO_w(OH)_x(H_2O)_yX_z$ in which M is a metal such as iron, X is the anion of the reactant salt, and $w+x+y+z$ maintains charge neutrality with, and meets valence requirements of, the metal M. Control of the extent of precipitation controls the uniformity and magnitude of the particle sizes and ultimately the fiber diameter.

The methanolic sol was thoroughly shaken to resuspend settled particles to provide a uniform suspension before application to the substrate surface.

In the sol preparation method as described above, salts of the fiber growth promoter metal are utilized which are soluble in the liquid solvent chosen for the sol. Examples of suitable salts in addition to nitrates include halides such as chlorides, bromides or iodides, and others such as acetates, oxalates, perchlorates, sulfates, phosphates and the like. Nitrates are preferred.

The liquid solvent chosen must produce a sol with the addition of an inorganic or an organic base to the metal salt solution. Examples of suitable liquid solvents include water, for some substrates, and organic liquids. Organic liquids include alcohols such as methanol, ethanol and isopropanol, and other organics including ketones such as acetone and methylethylketone, and ethers such as diethyl-, dimethyl- or methylethyl-ether and the like. Preferably an alcohol such as methanol are utilized.

The concentration of fiber growth promoter material precursor in solution before pH adjustment is generally about 0.001M to about 0.5M, and when iron salts are utilized, preferably about 0.006M to about 0.1M.

The bases utilized to form the sol upon titration of the metal salt/solvent solution may contain a hydroxide ion and include ammonium hydroxide, tetramethyl-, tetraethyl-, tetra-ethyl- or tetrapropyl-ammonium hydroxide, and inorganic hydroxides such as sodium or calcium hydroxide. Suitable amine bases include trimethylamine, triethylamine, or ethylenediamine. Ammonia can be used, preferred is ammonium hydroxide.

The pH of the metal salt/solvent solution upon addition of the base should be adjusted to at least about 7 (when the solvent is organic, in a relative sense, that is, as ready by a pH meter), and preferably is in the range of 7 to 10. Sols formed with pH adjustment to less than about 7, when applied to substrates as described below, lead to nonuniform deposition of the fiber growth promoter material precursors. In the case of mixed promoters, the pH should be adjusted to a level such that all desired components precipitate out.

Figure 3:
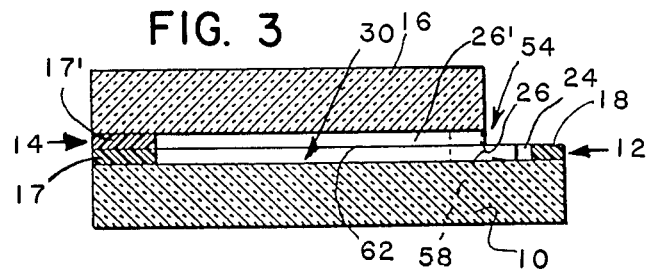
FIG. 3 is a scanning electron photo micrograph (magnification 390X) of a heat treated VLS graphite substrate coated with a sol prepared using iron nitrate and water.

The failure to adequately wet the substrate surface, resulting in nonuniform promoter material precursor deposition was also observed when a sol prepared from an aqueous solution of iron nitrate was used in the substrate preparation method, FIG. 3, for a graphite substrate. Upon application, the liquid beaded up because of the poor wetting. As a result, after air drying, a nonuniform distribution of hydrous iron oxide had deposited on the graphite, resulting in local differences in iron concentration.

The supernatant liquid is preferably removed from the sol before application to the substrate, in order to avoid the formation of deposits of salt, such as $NH_4(NO_3)$ used in the example above, or other impurities on the substrate. If present, these impurities could deleteriously affect inorganic fiber uniformity.

In an alternative embodiment, the sol can be prepared by introducing sized metal oxide particles, such as iron oxide pigments into a liquid capable of wetting the substrate.

Substrate Treatment

The sol solution can be applied to the substrate by dipping, brushing, spin coating, using a draw bar and most preferably, by pipetting to achieve reproducible loadings of fiber growth promoter material. No binder is required, as the sol adheres directly to the substrate surface. Thus, the sols used in the present invention are essentially free of binder.

The volume of sol to be applied to the substrates can vary according to concentration of components, consistency of the sol and size of the substrates. The sol prepared as described above was applied to a 2 inch (5 cm) square graphite substrate in an amount of 1 ml to 3.5 ml, preferably 2.5 ml, covering one surface. The sol was allowed to dry in air, and gave a coating of about 40 mg to about 150 mg, preferably 65 mg on each 2 inch (5 cm) square.

With a wetting solvent the sol applied smoothly and evenly to the graphite and after air drying, the dried coating produced a uniform hydrous iron oxide coating on the substrate which adhered to the substrate such that it could be inverted (in the conventional VLS position) without the fiber growth promoter precursor falling off. Care should be exercised not to load the sol too thickly, as this may cause the material to flake off upon drying.

Drying at or near ambient temperature provides "islands" of hydrous iron oxide on the graphite which may give rise to promoter particles upon heating to about 1000° C., as depicted in FIG. 1. By varying concentration and/or amount of sol applied, the size of the islands, the size of the growth promoter particles and ultimately the diameter of the fibers to be produced can be controlled. This cannot be achieved with conventional substrate preparation methods. Nor can it be achieved with a nonwetting solvent because the nonuniform distribution of hydrous iron oxide formed after drying eventually gives rise to a nonuniform distribution of catalyst particles. Neither can it be achieved with a solution due to the problems stated hereinabove regarding the nonuniform size distribution of small particles.

In order to form discrete particles of the fiber growth promoter material on the substrate to serve as nucleation sites for fiber growth, the sol coating is heat treated. Preferably, the treatment includes heating the coated substrate under an argon atmosphere at a temperature of about 1000° to 1500° C., preferably 1400° to 1425° C., either as a separate step or as the startup procedure of a VLS reaction. Other inert gases can also be utilized in addition to or instead of argon.

Promoter material may react with the substrate at the heat treatment temperature. For example, particles of hydrous iron oxide reacted with the graphite substrate such that they adhered tenaciously and could be removed only by scraping. Above 1000° C., the iron oxide is reduced by graphite to give particles of iron or iron containing small amounts of carbon embedded in slight holes in the graphite, as depicted in FIG. 1.

VLS Reaction-Formation of SiC

The VLS process and reaction conditions are known for many inorganic fibers. In accordance with one embodiment of the present invention, the VLS reaction is performed by heating the sol coated substrates over a carbon/silicon dioxide bed to 1300° to 1500° C., preferably 1400° to 1425° C. under argon or other inert gas. The gas flow is then changed to a mixture of hydrogen, carbon monoxide, nitrogen and methane, and the fiber producing reaction is allowed to proceed. During the reaction, the C/SiO$_2$ bed generates silicon monoxide (SiO) via the following reactions:

$$C + SiO_2 \rightarrow CO + SiO \quad (I)$$

or

$$SiO_2 + H_2 \rightarrow SiO + H_2O \quad (II)$$

where both the reactions I and II equilibriums are controlled by the flow of the reactive gases. The major function of hydrogen in the gas mixture, however, is thought to be the maintenance of the fiber growth promoter material in a reduced state.

The SiO formed from the C/SiO$_2$ bed and carbon from the CH$_4$ feed are absorbed by the fiber growth promoter material dispersed on the substrate. When the molten promoter material becomes saturated with the two species, SiC precipitates out in the form of single crystal fibers. Contact time can vary. After the VLS reaction, the silicon carbide fibers will have a metallic sphere, containing iron and silicon at one end.

We have found that the utilization of SiO and SiC fiber growth can be enhanced by beginning the gas flow of the H$_2$/CO/N$_2$/CH$_4$ mixture just before the C/SiO$_2$ reaction temperature is reached, so that CO is present to prevent overproduction of SiO (according to reaction I) which might otherwise react with the promoter such as iron without carbon present to produce a silicon-rich alloy less active for growing fibers. The gas mixture should not be started too soon, however, to prevent hydrogen from causing deleterious effects on the promoter distribution such as puddling.

Reactive gas mixtures for VLS reactions are known as well as variations in molar ratios of the reactants. A typical atmosphere for conducting a VLS silicon carbide fiber growth process is 82 percent hydrogen, 10 percent carbon monoxide, 7.5 percent nitrogen and 0.5 percent methane. To generate SiO from a C/SiO$_2$ bed, the ratio of the reactants is not critical, however, a 2.5:1 molar ratio of C to SiO$_2$ has been utilized and is preferred. In other embodiments, SiH$_4$ or other gaseous silanes may be used as a silicon source.

EXAMPLES

The examples below are intended to illustrate, but not to limit, the present invention.

The heat treatment and VLS reactions described below and reported in Table I were conducted in a horizontal tube furnace with the temperature controller modified to allow for ramping capabilities. All samples were reacted inside an alumina tube 36 inches (90 cm) long, having an inner diameter of 2.75 inches (7 cm) and an outer diameter of 3 inches (7.5 cm). The ends of the alumina tube were sealed (aluminum plates with a Viton gasket) and connected to a controlled gas flow system. Controlling and monitoring thermocouples were outside the alumina tube in the furnace.

A 10 inch (25 cm) long, hollowed out graphite boat with holes cut in the ends to allow for uninterrupted gas flow through the reaction zone was used as a reaction vessel. For VLS reactions, 25 g of a 2.5:1 C/SiO$_2$ mixture (molar ratio) in the form of Thermax carbon black and Fisher Scientific 325 mesh silica, was placed in the hollowed out portion of the boat. Two graphite substrates with the promoter material coating facing downward over the top of the C/SiO$_2$ bed were set on top of the reaction vessel, flanked by two uncoated graphite substrates. It is to be understood that the scope of the present invention includes utilizing substrates with promoter material facing upward or to the side, depending upon reactor configuration. Reactor tube volume was calculated to be 176.7 cubic inches (2895.6 cc).

The reaction vessel was placed in the center of the alumina tube with approximately 6 inches (15 cm) of graphite insulating bricks on either side of it. The tube was sealed, and evacuated to a pressure of 200 mtorr. The tube was back filled with argon to atmospheric pressure, and once purged with argon, the sample was heated to 1400° C. over a 3 hour period with Ar flow of 200 cc/min.

For VLS reactions, the gas mixture of H$_2$/CO/N$_2$/CH$_4$ was introduced and the reaction allowed to proceed at 1425° C. for 10 hours.

EXAMPLES 1-12

Graphite substrates were prepared for VLS reaction according to the following procedure. 2.43 g of Fe(NO$_3$)$_3$.9H$_2$O was dissolved in 100 ml of methanol to form a 0.06M solution of iron. The solution was titrated with concentrated NH$_4$OH to obtain a pH metal reading of 7. A brown-orange precipitate formed that was allowed to settle out in a closed container. 35 ml of the supernatant was removed, and the remaining volume of sol was used to prepare substrates. About 2.5 cc of the sol was pipetted onto each of the 2 inch (5 cm) square graphite substrates to cover one surface entirely. The amount of sol applied to each substrate after drying is reported in Table I.

The sol covered substrates were allowed to dry in air for about one hour, with a hydrous iron oxide coating forming on the surface of the substrate.

The sol coated substrates were then placed on top of the graphite reaction boat, with the coated side facing downward. The boat was then fired inside the alumina tube after evacuation with Ar flowing at 200 cc/min. The temperature was ramped at 7.7° C./min to 1400° C. where it was held for 5 to 10 minutes.

The resulting product was a VLS substrate with a surface containing a relatively uniform distribution of securely bound iron containing particles. The average size of the particles on the substrate, as depicted in FIG. 1, as determined by scanning electron microscopy (SEM), fell into the 30-50 micron range with about 100 microns between the particles. Energy dispersive spectroscopic (EDS) analysis of the substrates showed no residual iron between the particles, representing an ideal surface for use in the VLS reaction for silicon carbide fiber growth.

The substrates prepared as above were utilized in pairs in a VLS reaction to form SiC fibers. For Examples 1-8, the reaction gas mixture of $H_2$ (200 cc/min), CO (25 cc/min), $N_2$ (18.75 cc/min) and $CH_4$ (1.25 cc/min) was introduced into the reactor in time to purge it before the temperature reached 1425° C., that is, the flow was begun about 12 minutes prior to the reactor reaching 1425° C. For Examples 9-12, the flow rate of each component was halved, and the mixture flow was started about 23 minutes before the temperature reached 1425° C.

Ten hours of reaction yielded green beta-SiC fibers, approximately 1 inch (2.5 cm) long and on average, 10 microns in diameter. The SiC fibers were attached to the substrate at one end, and contained a small sphere of FeSi alloy at the other end. It should be noted that at silicon carbide VLS run conditions the iron containing particles, such as those depicted in FIG. 1, become an iron/silicon alloy prior to fiber production. The results of the VLS reaction runs are set forth in Table I, below.

TABLE I

| Example No. | Results of VLS Reaction | | |
|---|---|---|---|
| | Sol Wt. (gm) | Gas Flow (cc/min) | Fiber Yield (mg/cm$^2$) |
| 1 | 0.0601 | 245.0 | 2.70 |
| 2 | 0.0612 | 245.0 | 2.39 |
| 3 | 0.0419 | 245.0 | 2.07 |
| 4 | 0.0532 | 245.0 | 2.69 |
| 5 | 0.0743 | 245.0 | 2.21 |
| 6 | 0.0688 | 245.0 | 2.22 |
| 7 | 0.0658 | 245.0 | 2.31 |
| 8 | 0.0701 | 245.0 | 2.51 |
| 9 | 0.0669 | 122.5 | 2.69 |
| 10 | 0.0715 | 122.5 | 3.02 |
| 11 | 0.0592 | 122.5 | 2.51 |
| 12 | 0.0615 | 122.5 | 2.72 |

EXAMPLE 13

Figure 2:
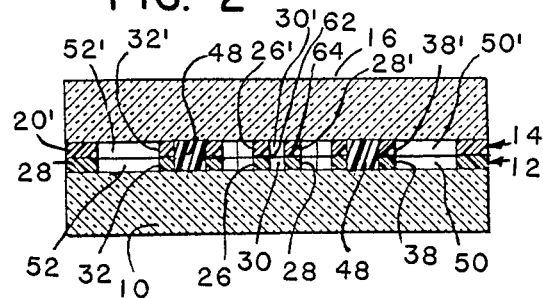
FIG. 2 is a scanning electron photo micrograph (magnification 100X) of a heat treated VLS graphite substrate coated with a sol prepared using iron nitrate, chromium nitrate, nickel nitrate and methanol according to the present invention.

A mixed promoter containing sol was prepared in methanol to provide a promoter of composition 69.4% Fe, 16.5% Cr and 14% Ni (by weight) from their respective nitrate salts. Titration with $NH_4OH$ was carried out until the pH meter reading was equal to 10 to ensure precipitation of all three metals in the solution. The sol was applied to graphite substrates and was heat treated to 1400° C. under argon. The particle distribution of promoter material on the surface of the substrates, depicted in FIG. 2, was uniform and similar to that exhibited by the iron nitrate/methanol sols, hereinabove. EDS analysis indicated that all three metals were present in approximately the theoretical concentrations.

Based upon the disclosure of this specification, the pH adjustment for combinations of metal components according to this invention can be determined experimentally by those skilled in the art. For example, a pH of 7 was not sufficient to precipitate out all of the metal components of example 13, while a pH of 10 was, and a pH of 10 did not render uniform particle distribution of a 50/50 Fe/Mn combination. Within the disclosure of the invention, however, these variations can be readily recognized and compensation or adjustments made.

Comparative Example A

A sol was prepared using an aqueous solution of iron nitrate and applied to graphite substrates according to the procedure outlined for examples 1-12. After heat treatment in argon, the substrate surface exhibited non-uniform particle distribution, as depicted in FIG. 3. The iron containing particles were oddly shaped and scattered randomly, with the average particle size determined by quantitative image analysis to be 55 microns, with 74.3% of the particles between 35 and 75 microns. The water based sols exhibited a slower drying time than the organic based sols.

The poor substrate wetting ability of the water based sol for graphite substrates as compared to the organic based sol gave an uneven coating which resulted in a very poor catalyst particle distribution upon heating. The nature of the catalyst precursor and the catalyst particles was not changed by using water, but the distribution of catalyst particles was adversely affected. In both instances, hydrous iron oxide would be deposited on the substrate and then reduced at high temperatures to form iron or iron containing carbon catalyst particles.

Although water based sols are not suited according to the present invention for use with graphite substrates, they are suitable for use with substrates the surface of which they wet uniformly. In another embodiment, a surfactant can be added to the aqueous sol such that wetting of graphite is achieved. Suitable surfactants include water soluble ionic or nonionic surfactants. Examples of suitable surfactants include, but are not limited to, Fluoread SC-99 (a tradename for fluorochemical surfactant) and Triton X-100 (tradename for an alkylarylpolyether alcohol).

Paired graphite substrates coated with a sol prepared using iron nitrate and water were tested in a VLS reaction according to the procedure set forth above, and produced much lower than average SiC yields of 1.51 and 1.12 mg/cm$^2$.

Comparative Example B

Graphite substrates were prepared according to the conventional method of dipping one face of a 2 inch (5 cm) square substrate into a binder solution of 100 g polymethylmethacrylate, 100 g methylethylketone (MEK) and 3 g of a fumed silica (Cabosil, obtained from Cabot Corporation). The substrate was dried at 80° C. for 30 minutes and reweighed. The promoter alloy powder, $Fe_{80}Si_{20}$, obtained from Alloy Metals, Inc. was sprinkled onto the coated substrate through a −400 mesh sieve. A weight of 11 to 20 mg of the powder was obtained by tapping the substrate until the correct weight was reached. The substrate/binder was cured at 180° C. for 45 minutes, securing the powder to the substrate to give the VLS substrate. The binder does not react chemically with the promoter, but serves as a matrix to hold the promoter onto the substrate.

The substrate prepared by this method which is depicted in FIG. 4, exhibited inhomogeneity in the broad particle size range of the powder, translatable into a wide range of fiber diameters. The poor distribution of powder also resulted in particle clumping, translatable into a wide range of fiber diameters and in unused portions of the substrate that lead to reduced fiber yields. The dip or brushing method of applying the binder was also difficult to reproduce in terms of binder weight. Accordingly, numerous substrates were required in order to achieve paired substrates suitable with regard to correct binder weight for use in the VLS process.

The substrates prepared as in Comparative Example B were used in a VLS reaction according to the above procedure to produce SiC fibers. When binder weight was less than 45 mg, there were spots of no growth and less dense growth overall. When the binder weight was 60 mg or greater, a considerable amount of black, fuzzy undergrowth appeared on the substrate among the fiber.

It should be noted that FIGS. 1–4 were taken at various magnifications in order to resolve the particles present, and a one to one comparison should not be made. However, it can be seen overall that the particle size and particle distribution of FIGS. 1 and 2 substrate surfaces prepared according to the inventive method are more uniform and homogeneous than those exhibited in FIGS. 3 and 4.

EXAMPLES 14–16

Direct comparison was made of the method to prepare VLS substrates according to the present invention versus the conventional binder method, with regard to fiber yield, utilizing such substrates in a VLS silicon carbide fiber production process.

In each example, one half the substrate was prepared by the binder method, and the other hand by the inventive sol method. Results of the VLS production of silicon carbide fibers are reported in Table II. Graphite substrates 11.25 inches (28.1 cm) by 2.125 inches (5.3 cm) were divided along the long axis, and masking tape covered one side. The uncovered side was immersed in the acryloid resin (3 g Carbosil, 100 g resin, 150 g methylethylketone) and cured for 5 minutes in a preheated 50° C. oven. The tape was removed and the substrate was cured for another 5 minutes. Fifty milligrams of the standard $Fe_{80}Si_{20}$ fiber growth promoter material was sprinkled on the substrate, the sol side being covered with a strip of paper. The binder side was completed by curing at 120° C. for 30 minutes.

One hundred milliliters of a sol prepared using iron nitrate and methanol with $Fe^{3+}$ concentration of 0.0938M was prepared for each substrate and allowed to settle. Prior to use, 43 ml of supernatant was removed. Each sol side was coated with 5.8 ml of stirred sol by dropper. The concentration and amounts were selected such that each side (binder and sol) had approximately the same number of fiber growth promoter particles, with an equal mass loading per unit area. The sol was dried in air, at room temperature.

The coated substrates were placed in a reactor in separate runs and were subjected to VLS conditions under an atmosphere of 81.7% $H_2$, 10.2% CO, 7.6% $N_2$ and 0.5% $CH_4$ at a flow rate of 3.093 l/min and a temperature of 1450° C. for 8 hours. A test run with substrates where the sol had been applied over the entire surface confirmed that each substrate side could produce approximately equal fiber yields. The sol side of the substrates in each of the foregoing examples, however, exceeded the binder side of the same substrate in fiber production, as set forth in Table II.

TABLE II

| Example | Gross Yield (mg) | | Yield (g/ft²-hr) | | Percent Improvement |
|---|---|---|---|---|---|
| | sol | binder | sol | binder | |
| 14 | 323 | 274 | 0.486 | 0.413 | 17.7 |
| 15 | 518 | 321 | 0.780 | 0.483 | 61.5 |
| 16 | 509 | 341 | 0.766 | 0.514 | 49.0 |

Where promoter material particle size and loading has been kept essentially the same, the substrates prepared by the method of the present invention, when utilized in the VLS silicon carbide process, consistently outperformed substrates prepared according to the conventional "binder" method with regard to fiber yield.

From the examples described above, it is apparent that the method of the present invention results in substrates for the VLS reaction having improved uniformity of fiber growth promoter particle size and distribution. The inventive method permits the incorporation of more than one metal components into the promoter without adversely affecting particle size or distribution. The results of the inventive method are more reproducible than those of conventional methods. The method provides an easy procedure for preparing substrates, and a less expensive one compared to use of more expensive sized alloy powders or capital equipment.

The VLS process of the present invention results in improved fiber yields. Additionally, the VLS process using the improved substrates minimizes the black undergrowth of material produced among SiC fibers and permits better control of fiber diameter.

It is apparent that the inventive methods accomplish the objective of VLS process improvement as described hereinabove. The foregoing examples of fiber growth promoters, substrates, reaction conditions and the like are meant to be illustrative of the inventive methods, and are not intended to limit the invention, which includes all modifications and variations that fall within the scope of the following claims and their equivalent embodiments.

We claim:

1. A method of preparing a non-metallic, high temperature resistant substrate for a VLS fiber producing reaction comprising the steps of:
    forming a solution of a metal salt in an alcohol;
    adding a base to said solution to precipitate out a colloidal suspension of hydrous metal oxide catalyst precursor particles to form an alcohol sol capable of wetting the substrate and forming catalyst particles having an average size of at least about 20 microns during the subsequent VLS fiber producing reaction;
    applying said sol to at least one surface of the substrate; and
    drying said sol.

2. A method, as set forth in claim 1, wherein said alcohol is selected from the group consisting of methanol, ethanol and propanol.

3. A method, as set forth in claim 2, wherein said alcohol is methanol.

4. A method, as set forth in claim 1, wherein said catalyst precursor particles are added as a salt of at least one metal selected from the group consisting of iron, manganese, nickel, cobalt, chromium, molybdenum, lanthanum and mixtures thereof.

5. A method, as set forth in claim 4, wherein said salt is selected from the group consisting of nitrate, chloride, bromide, iodide, acetate, oxalate, perchlorate, sulfate, phosphate or mixtures thereof.

6. A method, as set forth in claim 5, wherein said salt is a nitrate.

7. A method, as set forth in claim 1, wherein said catalyst precursor particles contain iron.

8. A method, as set forth in claim 7, wherein the molarity of said iron in said alcohol solution is between about 0.006 and 0.1.

9. A method, as set forth in claim 1, wherein said catalyst precursor particles contain iron, chromium and nickel.

10. A method, as set forth in claim 1, wherein said catalyst precursor particles contain iron and nickel.

11. A method, as set forth in claim 1, wherein the molarity of said compound in said alcohol solution is between about 0.001 and 0.5.

12. A method, as set forth in claim 1, wherein said base is introduced to adjust the pH of said solution to at least 7 as measured by a pH meter.

13. A method, as set forth in claim 1, wherein said base is selected from the group consisting of ammonium hydroxide, tetramethylammonium hydroxide, tetraethylammonium hydroxide, tetrapropylammonium hydroxide, sodium hydroxide, calcium hydroxide, trimethylamine, triethylamine, ethylenediamine, ammonia or mixtures thereof.

14. A method, as set forth in claim 1, wherein said base is ammonium hydroxide.

15. A method, as set forth in claim 1, comprising a further step of heat treating said sol applied substrate in an inert gas atmosphere at a temperature of about 1000° C. to about 1500° C.

16. A method, as set forth in claim 15, wherein inert gas is argon.

17. A method, as set forth in claim 1, wherein said substrate is selected from the group consisting of graphite, glassy carbon, silicon carbide, silicon nitride and alumina.

18. A method for preparing a non-metallic, high temperature resistant substrate for the production of SiC fibers by the VLS process comprising the steps of:
   forming a solution of an iron salt in methanol;
   adding a base to said solution to precipitate out a colloidal suspension of hydrous iron oxide catalyst precursor particles to form a sol capable of wetting the substrate;
   applying said sol to at least one surface of the substrate;
   drying said sol; and
   heat treating said sol applied substrate in an inert gas atmosphere at a temperature of about 1000° C. to about 1500° C. to produce catalyst particles having an average size of at least about 20 microns.

19. A VLS substrate, as prepared by the method of claim 18.

20. A method, as set forth in claim 18, wherein said substrate is selected from the group consisting of graphite, glassy carbon, silicon carbide, silicon nitride and alumina.

21. A method of preparing a non-metallic, high temperature resistant substrate for a VLS fiber producing reaction comprising the steps of:
   forming a solution of a metal salt in a liquid;
   adding a base to said solution to precipitate out a colloidal suspension of hydrous metal oxide catalyst precursor particles to form a sol capable of wetting the substrate and forming catalyst particles having an average size of at least about 20 microns during the subsequent VLS fiber producing reaction;
   applying said sol to at least one surface of the substrate; and
   drying said sol.

22. A method, as set forth in claim 21, wherein said liquid is organic.

23. A method, as set forth in claim 21, wherein said liquid is selected from the group consisting of water, alcohols, ketones and ethers.

24. A method, as set forth in claim 21, wherein said metal is selected from the group consisting of iron, manganese, nickel, cobalt, chromium, molybdenum, lanthanum and mixtures thereof.

25. A method, as set forth in claim 21, comprising a further step of heat treating said sol applied substrate.

26. A method, as set forth in claim 21, wherein said liquid contains a surfactant.

27. A method, as set forth in claim 21, wherein said substrate is selected from the group consisting of graphite, glassy carbon, silicon carbide, silicon nitride and alumina.

28. A method for preparing inorganic fibers by a VLS process comprising the steps of:
   applying to at least one surface of a non-metallic, high temperature resistant substrate a sol coating containing catalyst precursor particles, said sol being capable of wetting said substrate and forming catalyst particles having an average size of at least 20 microns during the subsequent VLS fiber producing reaction, said sol coating being formed by adding a base to a solution of a metal salt;
   drying said sol coating; and
   contacting said substrate with gaseous components of said fibers at VLS reaction temperatures.

29. A method, as set forth in claim 28, wherein said sol coated substrate is heat treated prior to contacting with said gaseous components.

30. A method, as set forth in claim 28, wherein said substrate is selected from the group consisting of graphite, glassy carbon, silicon carbide, silicon nitride and alumina.

31. A method for the production of SiC fibers by the VLS process comprising the steps of:
   applying to at least one surface of a non-metallic, high temperature resistant substrate a sol coating containing SiC catalyst precursor particles, said sol being capable of wetting said substrate and forming catalyst particles having an average size of at least about 20 microns during the subsequent VLS fiber producing reaction, said sol coating being formed by adding a base to a solution of a metal salt;
   drying said sol coating; and
   contacting said substrate with silicon and carbo containing gases at a temperature of about 1300° C. to about 1500° C.

32. A method, as set forth in claim 31, wherein said silicon and carbon containing gases are provided by a mixture of SiO, CO, $N_2$, $H_2$ and $CH_4$.

33. A method, as set forth in claim 31, wherein said sol coating substrate is heat treated in an inert gas atmosphere at about 1000° C. to about 1500° C. prior to contacting with said silicon and carbon containing gases to produce said catalyst particles.

34. A method, as set forth in claim 33, wherein said inert gas is argon.

35. A method, as set forth in claim 31, wherein said metal salt contains at least one metal selected from the group consisting of iron, manganese, nickel, cobalt, chromium, molybdenum, lanthanum and mixtures thereof to precipitate out a colloidal hydrous oxides of said metal and said solution is formed in an alcohol.

36. A method, as set forth in claim 35, wherein said alcohol is methanol.

37. A method, as set forth in claim 35, wherein said base is ammonium hydroxide.

38. A method, as set forth in claim 31, wherein said substrate is graphite.

39. A method, as set forth in claim 31, wherein said temperature is about 1400° to 1450° C.

40. A method, as set forth in claim 31, wherein said silicon and carbon containing gases are provided by:
heating a bed of carbon and silicon dioxide to a temperature at which said carbon and silicon dioxide react to form carbon monoxide and silicon monoxide.

41. A method, as set forth in claim 40, comprising the further step of introducing a gas containing carbon monoxide to said bed just prior to reaching said reaction temperature.

42. A method, as set forth in claim 31, wherein said substrate is selected from the group consisting of graphite, glassy carbon, silicon carbide, silicon nitride and alumina.

* * * * *

UNITED STATES PATENT AND TRADEMARK OFFICE
CERTIFICATE OF CORRECTION

PATENT NO. : 4,911,781

DATED : March 27, 1990

INVENTOR(S) : Joseph R. Fox; Douglas A. White

It is certified that error appears in the above-identified patent and that said Letters Patent is hereby corrected as shown below:

Column 14, line 60, delete the word "carbo" and insert therefor the word -- carbon --.

Signed and Sealed this

Fourth Day of June, 1991

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,911,781

DATED : March 27, 1990

INVENTOR(S) : Joseph R. Fox and Douglas A. White

It is certified that error appears in the above-identified patent and that said Letters Patent is hereby corrected as shown below:

ON TITLE PAGE:

The title page should be deleted to appear as per attached title page.

Signed and Sealed this

Twenty-second Day of October, 1991

Attest:

HARRY F. MANBECK, JR.

*Attesting Officer*      *Commissioner of Patents and Trademarks*

United States Patent [19]

Fox et al.

[11] Patent Number: 4,911,781

[45] Date of Patent: Mar. 27, 1990

[54] VLS FIBER GROWTH PROCESS

[75] Inventors: Joseph R. Fox, Solon; Douglas A. White, Cleveland Heights, both of Ohio

[73] Assignee: The Standard Oil Company, Cleveland, Ohio

[21] Appl. No.: 311,454

[22] Filed: Feb. 16, 1989

Related U.S. Application Data

[63] Continuation-in-part of Ser. No. 46,829, May 5, 1987, abandoned.

[51] Int. Cl.$^4$ .................. C01B 31/36; C01B 25/18
[52] U.S. Cl. .................. 156/607; 156/609; 156/612; 156/614; 156/DIG. 112; 501/12; 501/35; 501/95; 23/300; 423/346; 427/397.7; 427/190; 427/193; 264/DIG. 19
[58] Field of Search ............... 501/12, 35, 95; 156/607, 609, 612, 614, DIG. 112; 23/300; 423/346; 427/397.7, 190, 193; 264/DIG. 19

[56] References Cited

U.S. PATENT DOCUMENTS

| | | | |
|---|---|---|---|
| 3,423,179 | 1/1969 | Webb et al. | 23/208 |
| 3,519,472 | 7/1970 | Dyne et al. | 117/106 |
| 3,622,272 | 11/1971 | Shyne et al. | 23/208 |
| 3,630,691 | 12/1971 | Burnett et al. | 23/300 |
| 3,692,478 | 9/1972 | Knippenberg et al. | 423/345 |
| 3,721,732 | 3/1973 | Knippenberg et al. | 423/346 |
| 3,778,296 | 12/1973 | Thalmann et al. | 117/106 C |
| 3,840,647 | 10/1974 | Tomita et al. | 423/291 |
| 3,875,296 | 4/1975 | Brubaker | 501/108 |
| 4,013,503 | 3/1977 | Knippenberg et al. | 156/609 |
| 4,491,569 | 1/1985 | Tibbets | 423/447.3 |
| 4,500,504 | 2/1985 | Yamamoto | 423/345 |
| 4,612,138 | 9/1986 | Keiser | 252/313.2 |
| 4,732,879 | 11/1988 | Kalinowski et al. | 502/171 |
| 4,789,537 | 12/1988 | Shalek et al. | 423/346 |
| 4,806,198 | 2/1989 | Jagota et al. | 501/95 |

FOREIGN PATENT DOCUMENTS

| | | |
|---|---|---|
| 197686 | 10/1986 | European Pat. Off. |
| 2592399 | 12/1986 | France |
| 60-210600 | 10/1985 | Japan |
| 61-295299 | 12/1986 | Japan |
| 62-003098 | 1/1987 | Japan |
| 1360197 | 7/1974 | United Kingdom |

OTHER PUBLICATIONS

Hawley, *The Condensed Chemical Dictionary*, 10th Ed., Van Nostrand Reinhold Co., NY (1981) pp. 956, 958.

T. Takahashi, K. Sugiyama and H. Itah "Single Crystal Growth of Titanium Carbide by Chemical Vapor Deposition" Electrochemical Soc.: Solid State Science, vol. 117, No. 4 (Apr. 1970) pp. 541-545.

(List continued on next page.)

*Primary Examiner*—Brian E. Hearn
*Assistant Examiner*—Andrew Griffis
*Attorney, Agent, or Firm*—Larry W. Evans; Joseph G. Curatolo

[57] ABSTRACT

A method for preparing substrates for VLS fiber producing reactions and a method for preparing SiC fibers by the VLS process. The first method includes the steps of forming an alcohol sol containing a fiber growth promoter material precursor, applying the sol to at least one surface of the substrate and drying the sol. More particularly, the steps can include forming a sol of colloidal hydrous metal oxide particles in a liquid, the metal oxide being a fiber growth promoter material precursor and the liquid being capable of dissolving a salt of the metal and of wetting the substrate surface as a sol, applying the sol to at least one surface of the substrate and drying the sol. The method for the production of SiC fibers includes the steps of applying to at least one surface of a non-metallic, high temperature resistant substrate a sol coating containing a SiC fiber growth promoter material precursor, drying the sol coating and contacting the substrate with silicon and carbon containing gases at a temperature of about 1300° C. to about 1500° C.

42 Claims  Drawing Sheets